US009236010B2

(12) United States Patent
Choi et al.

(10) Patent No.: US 9,236,010 B2
(45) Date of Patent: Jan. 12, 2016

(54) ARRAY TEST DEVICE AND ARRAY TEST METHOD FOR ORGANIC LIGHT EMITTING DISPLAY DEVICE AND METHOD FOR MANUFACTURING THE ORGANIC LIGHT EMITTING DISPLAY DEVICE

(75) Inventors: Jae-Beom Choi, Yongin (KR); Won-Kyu Lee, Yongin (KR); Jae-Hwan Oh, Yongin (KR); Young-Jin Chang, Yongin (KR); Seong-Hyun Jin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 889 days.

(21) Appl. No.: 13/449,181

(22) Filed: Apr. 17, 2012

(65) Prior Publication Data

US 2012/0306939 A1 Dec. 6, 2012

(30) Foreign Application Priority Data

Jun. 3, 2011 (KR) ........................ 10-2011-0053955

(51) Int. Cl.
*G01R 31/06* (2006.01)
*G09G 3/32* (2006.01)
*G09G 3/00* (2006.01)

(52) U.S. Cl.
CPC .............. *G09G 3/3233* (2013.01); *G09G 3/006* (2013.01); *G09G 2300/0819* (2013.01); *G09G 2300/0852* (2013.01)

(58) Field of Classification Search
CPC ............ G09G 3/006; G09G 2320/045; G09G 2320/062; G09G 2320/0626; G09G 2320/0693; G09G 2340/16; G09G 3/3696; G09G 3/32–3/3611; G09G 2300/0852; G09G 2300/0819; G09G 2310/0264–2310/06; H01L 21/2026; H01L 21/268; G06F 3/0412; G01R 31/2635
See application file for complete search history.

(56) References Cited

U.S. PATENT DOCUMENTS

| | | | | |
|---|---|---|---|---|
| 2006/0028217 | A1* | 2/2006 | Liao et al. | 324/751 |
| 2007/0063935 | A1* | 3/2007 | Yoshida | 345/76 |
| 2012/0206145 | A1* | 8/2012 | Kim et al. | 324/414 |
| 2013/0257437 | A1* | 10/2013 | Jin et al. | 324/414 |

FOREIGN PATENT DOCUMENTS

| | | | |
|---|---|---|---|
| KR | 10-2006-0017586 | A | 2/2006 |
| KR | 10-2007-0027877 | A | 3/2007 |
| KR | 10-2010-0057067 | A | 5/2010 |

* cited by examiner

*Primary Examiner* — Vinh Nguyen
(74) *Attorney, Agent, or Firm* — Christie, Parker & Hale, LLP

(57) ABSTRACT

An array test method of an organic light emitting diode (OLED) display substrate is provided. The OLED display substrate includes a plurality of pixel circuits. Each pixel circuit includes an anode, a first transistor for transmitting a data signal that controls an amount of light emission of an OLED according to a scan signal, a driving transistor for receiving the data signal, generating a driving current corresponding to the data signal, and transmitting the driving current to the OLED, and a second transistor for diode-connecting a gate electrode and a drain electrode of the driving transistor. The array test method includes: injecting electrons or holes that generate an initialization voltage into the anode by turning on the second transistor; radiating electron beams at the anode; and determining whether or not the driving transistor performs normal operation from an amount of secondary electrons emitted from the anode.

10 Claims, 6 Drawing Sheets

ARRAY TEST DEVICE AND ARRAY TEST METHOD FOR ORGANIC LIGHT EMITTING DISPLAY DEVICE AND METHOD FOR MANUFACTURING THE ORGANIC LIGHT EMITTING DISPLAY DEVICE

CROSS-REFERENCE TO RELATED APPLICATION

This application claims priority to and the benefit of Korean Patent Application No. 10-2011-0053955 filed in the Korean Intellectual Property Office on Jun. 3, 2011, the entire content of which is incorporated herein by reference.

BACKGROUND

1. Field

Aspects of embodiments of the present invention are directed toward a test device of a display device, a test method, and a manufacturing method of a display device.

2. Description of Related Art

An organic light emitting diode (OLED) display is a flat display device that has a self emissive characteristic and does not require a separate light source. The OLED display has characteristics such as low power consumption, high luminance, and high response speed. In addition, the OLED display has excellent carrier mobility so that it can be applied to a high-speed operation circuit.

In the OLED display, transmission of a driving current to an OLED may be controlled by a transistor (for example, a driving transistor) formed in each pixel circuit. In such an OLED display, a predetermined driving current cannot be applied to the OLED when the transistor of the pixel circuit malfunctions or wires are disconnected or short-circuited.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward a test device of a pixel circuit array of an organic light emitting diode (OLED) display, and a manufacturing method of an OLED display. Embodiments of the present invention provide for a pixel circuit array test device of an OLED display and a test method thereof for accurate determination of normal operation of a driving transistor. Further embodiments of the present invention provide for a method for manufacturing an OLED display having excellent quality and reliability using the pixel circuit array test device and method according to an exemplary embodiment of the present invention.

According to aspects of embodiments of the present invention, a driving transistor is tested to determine an operation failure. In case of failure, a pixel circuit array can be repaired prior to a panel (cell) process so that a manufacturing yield can be improved. In particular, gate node voltages of a plurality of driving transistors in the array are commonly initialized and then measured so that whether the driving transistors are capable of performing normal operations can be accurately tested within a short period of time.

According to an exemplary embodiment of the present invention, an array test method of an organic light emitting diode (OLED) display substrate is provided. The OLED display substrate includes a plurality of pixel circuits. Each of the pixel circuits includes an anode; a first transistor for transmitting a data signal that controls an amount of light emission of an OLED according to a scan signal; a driving transistor for receiving the data signal, generating a driving current corresponding to the data signal, and transmitting the driving current to the OLED; and a second transistor for diode-connecting a gate electrode and a drain electrode of the driving transistor. The array test method includes: injecting electrons or holes that generate an initialization voltage into the anode by turning on the second transistor; radiating electron beams at the anode; and determining whether or not the driving transistor performs normal operation from an amount of secondary electrons emitted from the anode.

While the second transistor is turned on, the initialization voltage may be applied to a gate node of the driving transistor.

The initialization voltage may be higher than a threshold voltage of the driving transistor.

The injection of electrons or holes may be performed through radiation of electron beams for initialization.

The array test method of the OLED display substrate may be performed prior to completion of the OLED by forming an organic light emission layer and a cathode on the anode.

The first transistor may include a gate electrode coupled to a scan line for transmitting the scan signal, a first electrode coupled to a data line for transmitting the data signal, and a second electrode coupled to the gate electrode of the driving transistor.

The driving transistor may include the gate electrode coupled to the first transistor for transmitting the data signal, a first electrode coupled to a driving power source for supplying a first power voltage, and a second electrode coupled to the anode.

The second transistor may include a gate electrode coupled to a gate line for transmitting a gate signal, a first electrode coupled to a node where the driving transistor and the anode are commonly coupled, and a second electrode coupled to the gate electrode of the driving transistor.

The gate signal may be a signal that controls switching of the second transistor to compensate a threshold voltage of the driving transistor or to apply an initialization voltage to the gate electrode of the driving transistor.

Each of the pixel circuits may further include: a first capacitor including a first terminal coupled to the first transistor and a second terminal coupled to a driving power source for supplying a first power voltage for transmission of the driving current; and a second capacitor comprising a first terminal coupled to the first transistor and a second terminal coupled to the driving transistor.

According to another exemplary embodiment of the present invention, an array test device of an organic light emitting diode (OLED) display substrate is provided. The array test device includes a first electron beam injection means, a second electron beam injection means, an electron detecting means, and a driver for controlling driving of the first electron beam injection means, the second electron beam injection means, and the electron detecting means. The first electron beam injection means is for radiating a first electron beam at an anode of each of a plurality of pixel circuits included in a pixel circuit array. Each of the pixel circuits includes: an anode; a first transistor for transmitting a data signal that controls an amount of light emission of an OLED according to a scan signal; a driving transistor for receiving the data signal, generating a driving current corresponding to the data signal, and transmitting the driving current to the OLED; and a second transistor for diode-connecting a gate electrode and a drain electrode of the driving transistor. The second electron beam injection means is for radiating a second electron beam at the anode after a gate node voltage of the driving transistor is initialized to a reference voltage by the radiation of the first electron beam. The electron detecting means is for detecting an amount of secondary electrons emitted from the anode due to radiation from the second electron beam.

A radiation amount of the first electron beam may be different from that of the second electron beam.

The reference voltage may be higher than a threshold voltage of the driving transistor.

The first electron beam injection means and the second electron beam injection means include one electron beam device.

The one electron beam device may include an e-beam generator or an ionizer.

The first electron beam injection means, the second electron beam injection means, and the electron detecting means may be provided in each of a plurality of micro columns corresponding to ones of the plurality of pixel circuits included in at least one pixel line or pixel column. The micro columns may be configured to be fixed to a loading unit for testing the pixel circuit array, or be configured to be moved relative to the loading unit.

According to yet another exemplary embodiment of the present invention, a manufacturing method of an organic light emitting diode (OLED) display is provided. The method includes forming a pixel circuit array formed of a plurality of pixel circuits. Each of the pixel circuits includes: an anode; a first transistor for transmitting a data signal that controls an amount of light emission of an OLED according to a scan signal; a driving transistor for receiving the data signal, generating a driving current corresponding to the data signal, and transmitting the driving current to the OLED; and a second transistor for diode-connecting a gate electrode and a drain electrode of the driving transistor. The method further includes: radiating a first electron beam at the anode while the second transistor is turned on; determining whether or not the driving transistor performs normal operation by radiating a second electron beam at the anode and detecting an amount of secondary electrons emitted from the anode due to radiation from the second electron beam, after a gate node voltage of the driving transistor is initialized to a reference voltage by the radiation of the first electron beam; determining whether the pixel circuit array is a good product or a bad product based on the determination of whether the driving transistor performs normal operation; repairing the pixel circuit array determined to be a bad product; and completing an OLED of the pixel circuit included in the repaired pixel circuit array or in the pixel circuit array determined to be a good product.

The completing of the OLED may include forming an organic emission layer and a cathode on the anode.

The first electron beam and the second electron beam may be radiated through an e-beam generator or an ionizer.

The reference voltage may be higher than a threshold voltage of the driving transistor.

A radiation amount of the first electron beam may be different from that of the second electron beam.

Since whether the driving transistor performs normal operation can be tested using a relatively simple test device, the time and cost for a test process can be saved or reduced. Further, a panel (cell) process and a module process are not performed on a pixel circuit array determined to be a bad product so that manufacturing time and production cost can be saved or reduced.

DETAILED DESCRIPTION

Figure 1:
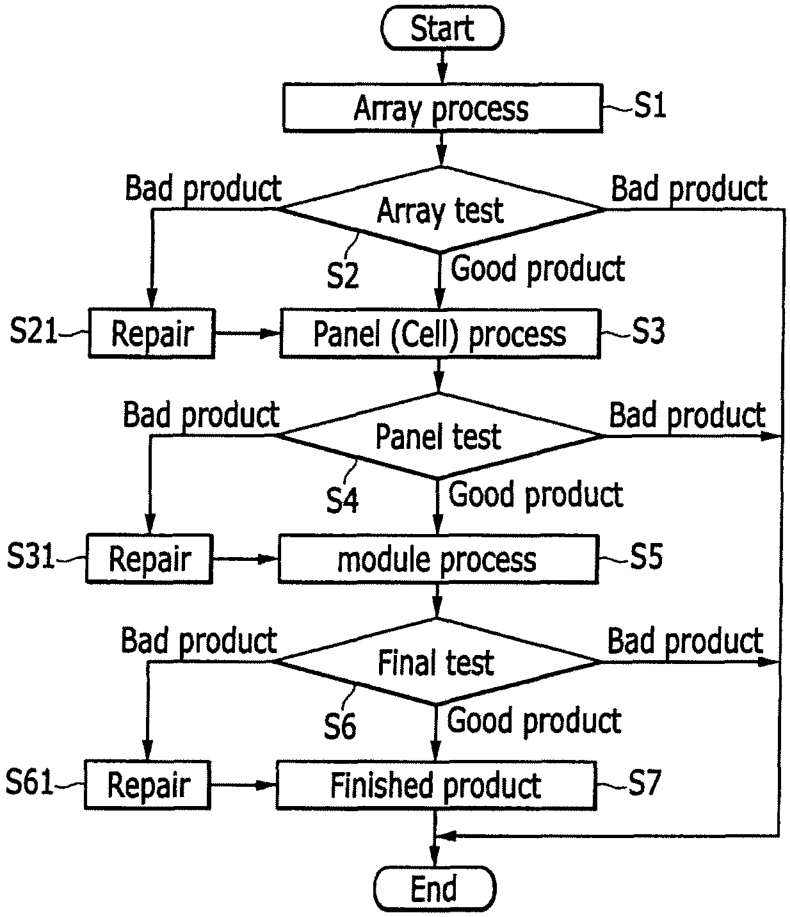
FIG. 1 is a flowchart for describing a manufacturing method of an organic light emitting diode (OLED) display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in the exemplary embodiments, like reference numerals designate like elements throughout the specification and are representatively described in a first exemplary embodiment. In later embodiments, only elements other than those of the first exemplary embodiment will be described. Further, the drawings and description are to be regarded as illustrative in nature and not restrictive.

Throughout this specification and the claims that follow, when it is described that an element is "coupled" to another element, the element may be "directly coupled" (for example, connected) to the other element or "electrically coupled" (for example, indirectly coupled or connected) to the other element through one or more third elements. In addition, unless explicitly described to the contrary, the word "comprise" and variations such as "comprises" or "comprising" will be understood to imply the inclusion of stated elements but not the exclusion of any other elements.

In exemplary embodiments, before forming an organic light emitting diode (OLED) display, the transistors of the pixel driving circuits may be tested to determine whether they perform normal operations or not. In addition, bad transistors may be repaired. If the bad transistors cannot be repaired, the next processes, such as a panel (cell) process and a module process, may be canceled to save or reduce manufacturing time and production cost.

However, in some OLED displays, a gate node of the driving transistor (for transmitting a driving current that corresponds to a data signal to the OLED) may be floated after completion of a thin film transistor (TFT) process. Thus, whether or not the driving transistor performs normal operation may not be accurately tested using conventional test equipment.

Accordingly, embodiments of the present invention provide for an array test device of an OLED display and an array test method for accurate determination of normal operation of a floated driving transistor by initializing a gate node of the floated driving transistor in the test of performance of transistors in a pixel circuit array.

A pixel circuit array test device (hereinafter, referred to as an array test device) and a pixel circuit array test method (hereinafter, referred to as an array test method) of an organic light emitting diode (OLED) display according to an exemplary embodiment of the present invention may be applied to a step prior to a panel (cell) process for completion of an OLED during a manufacturing process of the OLED display according to an exemplary embodiment of the present invention. The array test method may be performed through a process of initializing a gate node voltage of a driving transistor of a pixel driving circuit using the array test device and then determining whether or not the driving transistor connected to an anode of an exposed OLED (that is, an OLED before forming an organic light emission layer and a cathode) is operating normally by measuring the amount of secondary electrons emitted from the radiation of electron beams (E-beams) at the anode.

FIG. 1 is a flowchart of a manufacturing method of an OLED display according to an exemplary embodiment of the present invention.

Referring to FIG. 1, an array process (S1) for forming a pixel circuit array is first performed on a substrate. The pixel circuit array may be formed of pixel driving circuits, each of which includes three or more transistors (including a driving transistor) and at least one capacitor. In an exemplary embodiment, a unit pixel driving circuit where an operation test of the driving transistor is performed will be described in further detail with reference to FIG. 2 and FIG. 3.

Returning to the manufacturing method of FIG. 1, an array test (S2) is then performed. During the array test (S2), the pixel circuit array is tested to see whether or not the driving transistors are operating normally. A pixel circuit array determined to be a bad product in the array test (S2) may be repaired through a repairing process (S21), assuming the pixel circuit array can be repaired. If the pixel circuit array cannot be repaired, further production steps or processes on the pixel circuit array are terminated rather than performing another process on the pixel circuit array.

For a pixel circuit array determined to be a good product or successfully repaired (S21) after the array test (S2), an organic emission layer and a cathode are formed as part of a panel (cell) process (S3) to complete the corresponding OLEDs. A panel test (S4) is then performed.

A panel determined to be a bad product in the panel test (S4) may be repaired through a repairing process (S31), assuming the panel can be repaired. If the panel cannot be repaired, further production steps or processes on the panel are terminated and no further processes are performed.

For a panel determined to be a good product or successfully repaired (S31) after the panel test (S4), a module process (S5) is performed to produce a finished product. After the module process (S5), a final test (S6) is performed to determine if the module is a finished product or a bad product.

A module determined to be a bad product in the final test (S6) may be repaired through a repairing process (S61), assuming the module can be repaired. If the module cannot be repaired, the module may be terminated or discarded (for example, recycled, destroyed).

As shown in FIG. 1, an operation failure of the driving transistor is tested for after the array process (S1) and thus a failure of the pixel circuit array can be detected prior to the panel (cell) process and module process. As a result, the defective pixel circuit array can possibly be repaired, and accordingly a manufacturing yield can be improved. In addition, the panel (cell) process and the module process are not performed when the pixel circuit array is unrepairable, so that manufacturing time and production cost can be saved or reduced. A method for accurately testing whether or not the driving transistor is operating normally according to an exemplary embodiment of the present invention will be described in further detail with reference to FIG. 4.

Figure 2:
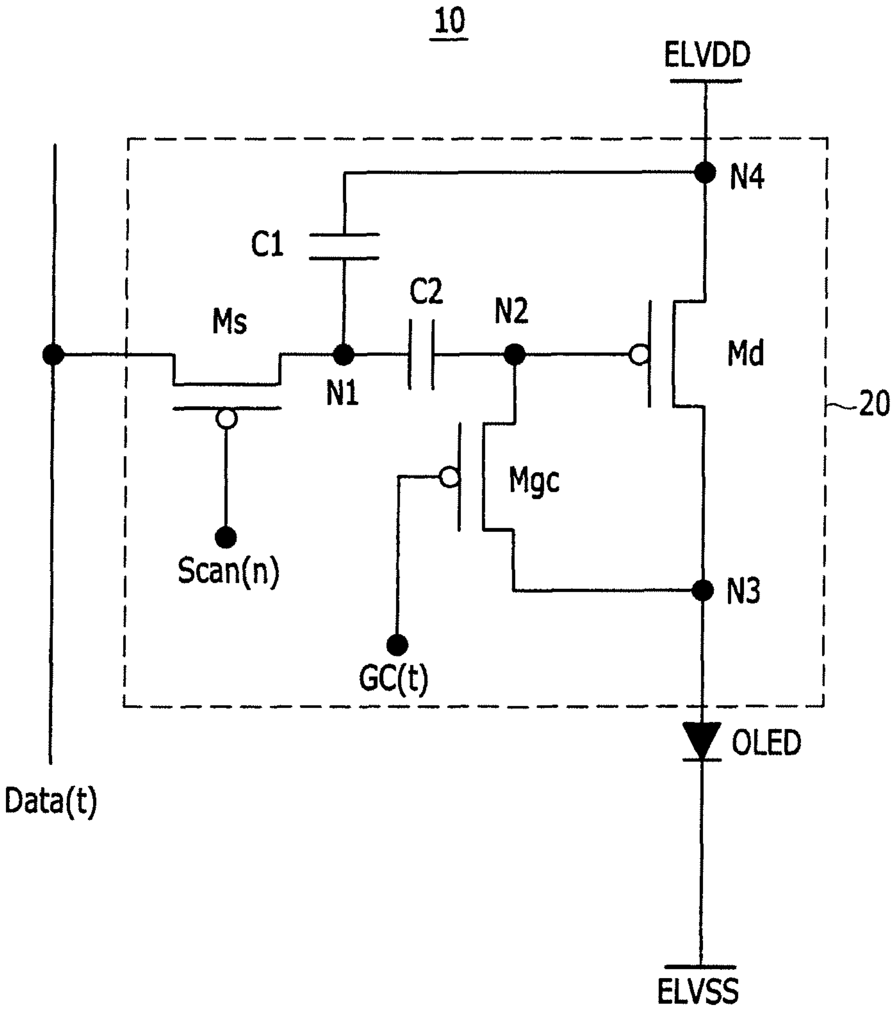
FIG. 2 is an equivalent circuit diagram of a unit pixel of an OLED display to which an array test device and a test method according to an exemplary embodiment of the present invention can be applied.

FIG. 2 shows an equivalent circuit diagram of a unit pixel 10 of an OLED display to which an array test device and a test method according to an exemplary embodiment of the present invention can be applied. Each pixel 10 includes an OLED and a three-transistor two-capacitor (3T2C) pixel driving circuit 20 formed of three transistors and two capacitors.

In further detail, the three transistors of the pixel driving circuit 20 include a driving transistor Md, a first transistor Ms, and a second transistor Mgc. The driving transistor Md is coupled between the OLED and a first power voltage source (ELVDD). The driving transistor Md transmits a driving current, corresponding to a data signal, to the OLED. Further, the first transistor Ms is for switching the data signal and transmitting the switched data signal to a gate electrode of the driving transistor Md. Finally, the second transistor Mgc is disposed between the gate electrode and a drain electrode of the driving transistor Md to diode-connect the driving transistor Md.

In addition, the two capacitors of the pixel driving circuit 20 include a first capacitor C1 for storing the data signal applied to the gate electrode of the driving transistor Md, and a second capacitor C2 for controlling a threshold voltage of the driving transistor Md.

In further detail, the gate electrode of the driving transistor Md is coupled to the second capacitor C2 at a second node N2. A first electrode of the driving transistor Md is coupled to the first power voltage source ELVDD, that is, a driving voltage (e.g., the first power voltage ELVDD) at a fourth node N4. A second electrode of the driving transistor Md is coupled to an anode of the OLED and a first electrode of the second transistor Mgc at a third node N3.

A gate electrode of the first transistor Ms is coupled to a scan line for transmitting a scan signal Scan(n) corresponding to the pixel 10. A first electrode of the first transistor Ms is coupled to a data line for transmitting a corresponding data signal Data(t). A second electrode of the first transistor Ms is coupled to the first capacitor C1 at a first node N1.

The first transistor Ms is a switching transistor that transmits a currently applied data signal Data(t) from the data line to the first node N1 in response to the scan signal Scan(n) corresponding to the pixel 10. Then, the first capacitor C1 coupled to the first node N1 stores a data voltage corresponding to the data signal Data(t) for a time period (for example, a predetermined time period). The driving transistor Md supplies a driving current—according to the data voltage corresponding to the data signal Data(t)—to the OLED.

A gate electrode of the second transistor Mgc is coupled to a gate line for transmitting a gate signal GC(t) for compensation of the threshold voltage of the driving transistor Md. The first electrode of the second transistor Mgc is coupled to the second electrode of the driving transistor Md at the third node N3. A second electrode of the second transistor Mgc is coupled to the gate electrode of the driving transistor Md and the second capacitor C2 at the second node N2.

The second transistor Mgc is a threshold voltage compensation transistor for compensating the threshold voltage of the driving transistor Md in response to the gate signal GC(t). In the array test method according to an exemplary embodiment of the present invention, the second transistor Mgc is turned on while a gate node of the driving transistor Md is initialized to a voltage (for example, a predetermined reference voltage, such as a voltage higher than the threshold voltage of the driving transistor Md) to diode-connect the driving transistor Md.

A first terminal of the first capacitor C1 is coupled to a first terminal of the second capacitor C2 and the second electrode of the first transistor Ms at the first node N1. A second terminal of the first capacitor C1 is coupled to the first power voltage source ELVDD (i.e., the first power voltage), which is a driving voltage to supply a current to the OLED at the fourth node N4.

The first terminal of the second capacitor C2 is coupled to the second electrode of the first transistor Ms and the first terminal of the first capacitor C1 at the first node N1. A second terminal is coupled to the gate electrode of the driving transistor Md and the second electrode of the second transistor Mgc at the second node N2.

The anode (i.e., pixel electrode) of the OLED is coupled to the second electrode of the driving transistor Md and the first electrode of the second transistor Mgc at the third node N3. A cathode (i.e., common electrode) of the OLED is coupled to a second power voltage source ELVSS, that is, a second power voltage ELVSS (i.e., common voltage).

The three transistors of the pixel driving circuit 20 may be PMOS transistors. A thin film transistor (TFT) may be exemplarily used as a field effect transistor. In other embodiments, the transistors may be realized as NMOS transistors. In this case, waveforms of signals driving the transistors may be inverted compared to when the corresponding transistors are realized as PMOS transistors.

Figure 3:
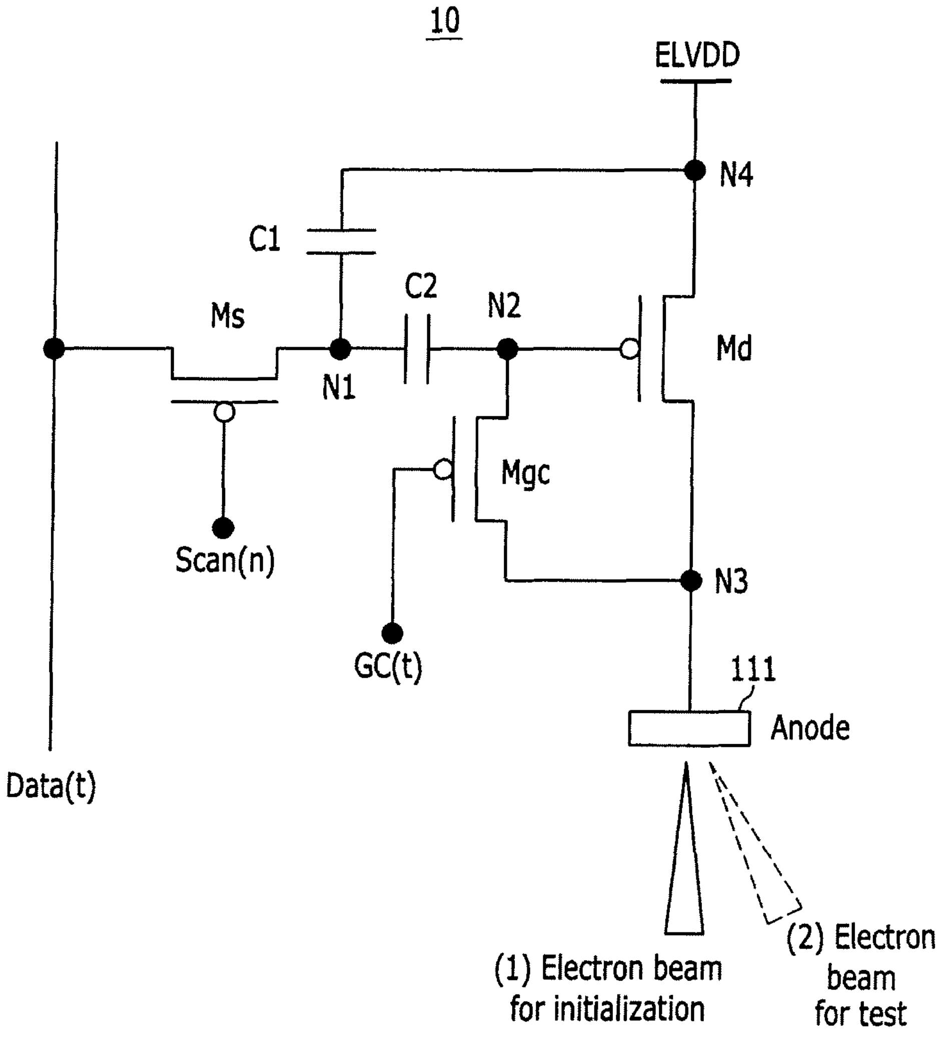
FIG. 3 shows application of an array test method according to an exemplary embodiment of the present invention to the unit pixel of FIG. 2.

FIG. 3 shows application of an array test method according to an exemplary embodiment of the present invention to the unit pixel of FIG. 2.

After realizing an array formed of a unit pixel such as the unit pixel shown in FIG. 2, the gate node of the driving transistor Md, that is, the second node N2, is floated. Thus, a voltage may not be directly applied to the gate node of the driving transistor with a conventional test device. Accordingly, whether or not the driving transistor performs normal operation and the level of the voltage at the anode may not be determined during the array test process.

Therefore, as shown in the exemplary embodiment of FIG. 3, the gate node voltage of the driving transistor Md floated after the array process is initialized to a voltage (for example, a predetermined reference voltage, such as a voltage higher than the threshold voltage of the driving transistor Md) prior to a test performed to determine whether or not the driving transistor Md performs normal operation. That is, an initialization electron beam 1 is radiated at an anode 111 of the OLED coupled to the third node N3 for injection of electrons.

While the initialization electron beam 1 is being radiated, the gate signal GC(t) transmitted to the gate electrode of the second transistor Mgc is transmitted as a gate-on voltage level, and the second transistor Mgc is turned on in response to the gate signal GC(t). Then, the second transistor Mgc diode-connects the driving transistor Md, and the electrons injected through the electron beam radiation are transmitted to the gate node of the driving transistor Md, that is, the second node N2, through the second transistor Mgc. A gate electrode of each driving transistor of each pixel driving circuit included in the pixel circuit array is thus initialized with a voltage (for example, a predetermined reference voltage) through radiation from the initialization electron beam 1. In this case, the reference voltage for initialization through the electron beam radiation is not particularly restrictive. For example, the initialization voltage may be higher than the threshold voltage of the driving transistor.

After the gate node voltage of the driving transistor Md is initialized to a given voltage, a test electron beam 2 is radiated at the anode 111 to test whether or not the driving transistor is operating normally. The radiation amount of the initialization electron beam 1 may be different from that of the test electron beam 2. It can be tested whether the driving transistor Md coupled to the anode 111 is operating normally or not by radiating the test electron beam 2 at the anode 111 and detecting secondary electrons emitted from the anode 111.

That is, electrons are equally injected into an anode of each pixel included in the pixel circuit array. Thus, when a driving transistor Md of a given pixel driving circuit in the pixel circuit array performs abnormally, an output voltage of the secondary electrons emitted from the anode of the corresponding pixel circuit becomes different from that of other pixel circuits that perform normally. In this case, the gate electrode of the driving transistor of each pixel driving circuit in the pixel circuit array has already been initialized with the initialization voltage. Therefore, it can be easily determined whether or not the driving transistor Md performs normal operation through radiation of the test electron beams and the detection of the corresponding secondary electrons.

FIG. 2 and FIG. 3 exemplarily illustrate the pixel driving circuit 20 as a 3T2C pixel driving circuit, but the present invention is not limited thereto. That is, in other embodiments of the present invention, the array test device and the array test method can be applied to a pixel driving circuit having, for example, a more complicated structure. For instance, the second transistor Mgc (or equivalent circuits) that can diode-connect the driving transistor Md to apply the array test device and method thereof as shown in FIGS. 1-3 can be employed in pixel driving circuits with more than three transistors according to other embodiments of the present invention.

As illustrated in FIGS. 1-3, the second transistor Mgc functions to apply a voltage to the gate node of the driving transistor Md in the array test stage of the exemplary manufacturing process of the OLED display. The second transistor Mgc may also function to compensate a threshold voltage of the driving transistor when the OLED display displays an image as a finished product.

Figure 4:
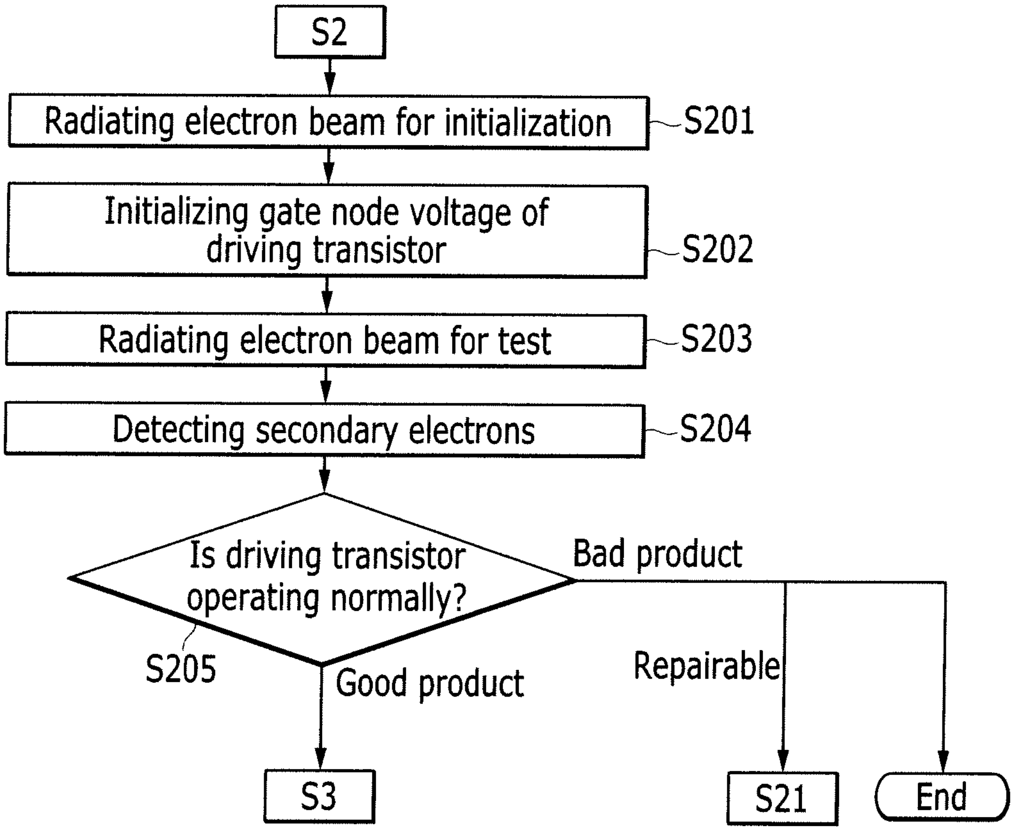
FIG. 4 is a flowchart for describing an array test method according to an exemplary embodiment of the present invention used in the manufacturing method of FIG. 1.

FIG. 4 is a flowchart for describing an array test method according to an exemplary embodiment of the present invention used in the manufacturing method of FIG. 1.

With reference to FIG. 4, a method for the array test (S2) in the manufacturing method of FIG. 1 of the OLED display will be described in further detail. After the pixel circuit array process (S1) proceeds, pixel circuits, which include transistors and capacitors forming the pixel driving circuit and an anode of an OLED, are mounted for each pixel on a transparent insulating substrate made of glass, quartz, ceramic, plastic, or the like.

After such a pixel circuit array is loaded on, for example, a loading unit (to which the array test device may also be attached), the initialization array beam is radiated at an anode of each pixel circuit (S201). In this case, an input value of electrons injected into the anode of each pixel is equivalent to each other. An e-beam generator or an ionizer may be used as a device for electron beam injection, but it is not restrictive. That is, a known device that can emit electrons or holes may be used.

During this process, the second transistor is turned on. Thus, the gate node voltage of the driving transistor is initialized to a voltage (for example, a predetermined reference voltage) by the electrons injected from the initialization electron beam (S202). In some embodiments, this voltage is larger than the threshold voltage of the driving transistor.

A gate node voltage of each driving transistor of each pixel driving circuit in the pixel circuit array is set by initialization. Then, the test electron beam is applied to an anode of each pixel circuit (S203).

Next, secondary electrons emitted from the anode of each pixel circuit are detected (S204). The gate electrode voltage of the driving transistor of each pixel is set to the reference voltage. Accordingly, it can be determined whether the driving transistor operates normally or not based on the amount of secondary electrons (S205).

When the driving transistor performs normal operation, the driving transistor undergoes the panel (cell) process (S3) as a good product. Otherwise, the driving transistor is operating abnormally as a bad product. If the driving transistor is repairable, the repairing process (S21) is performed. If the driving transistor is unrepairable, the further processes are canceled.

Figure 5:
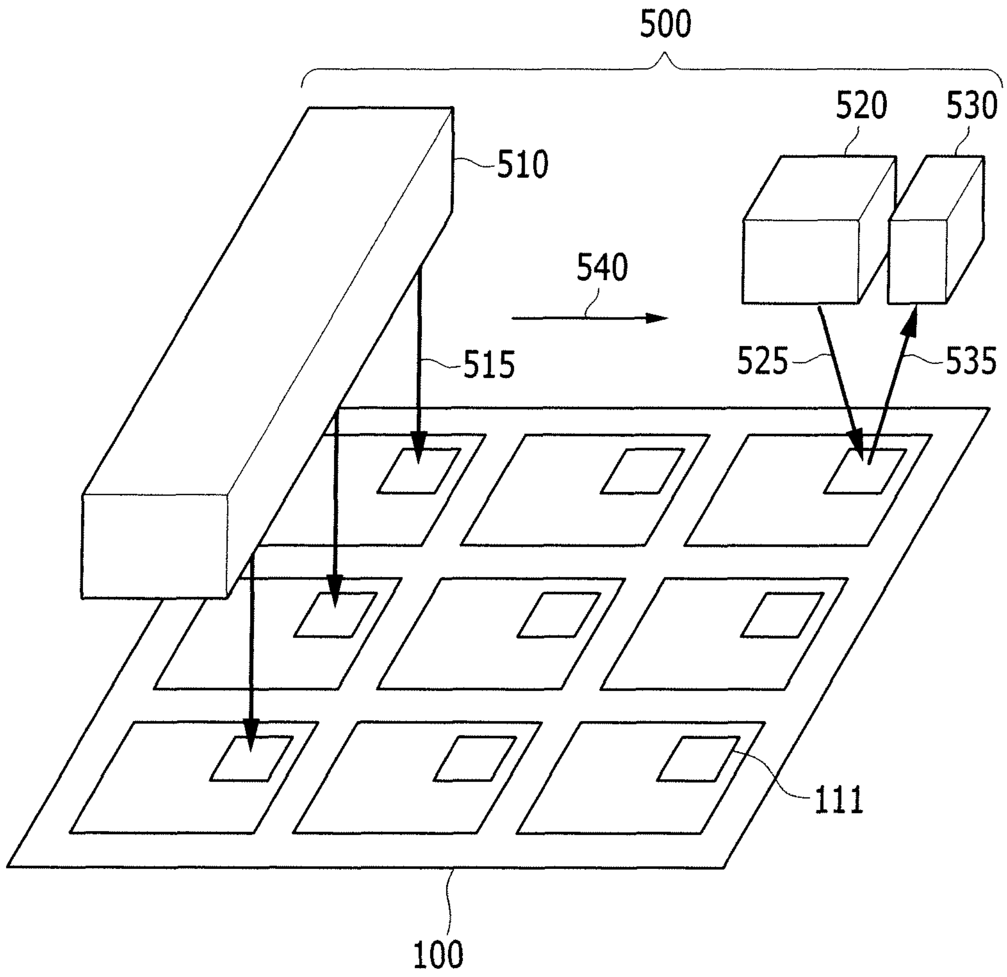
FIG. 5 is a schematic diagram of an array test device according to an exemplary embodiment of the present invention.

FIG. 5 is a schematic diagram for illustrating an array test device 500 according to an exemplary embodiment of the present invention.

Referring to FIG. 5, the pixel circuit array substrate 100 undergoes an array test through the array test device 500, which includes a first electron beam injector 510, a second electron beam injector 520, and an electron detector (or electron detecting device) 530, while moving in a first direction 540 with respect to the array test device 500. It should be noted that the first electron beam injector 510, the second electron beam injector 520, and the electron detector 530 could be part of the same device or be two or more separate devices. In addition, the array test device may further include a driver for controlling driving of the first electron beam injector 510, the second electron beam injector 520, and the electron detector 530.

In the exemplary embodiment of FIG. 5, the electron beam injector is dual-structured and thus, the initialization electron beam (from the first electron beam injector 510) and the test electron beam (from the second electron beam injector 520) are sequentially injected into the anode. However, the exemplary embodiment is not restrictive, and in other embodiments, the initialization electron beam and the test electron beam may be radiated time-divisionally using a single electron beam injector.

Referring to FIG. 5, the pixel circuit array substrate 100 moves in the first direction 540 with respect to the array test device 500. Thus, an initialization electron beam 515 is first injected into the anode 111 of each pixel circuit of the pixel circuit array from the first electron beam injector 510.

During an injection period of the initialization electron beam 515, the second transistor of the corresponding pixel is turned on and transmits electrons injected from the initialization electron beam to the gate node of the driving transistor. Thus, the gate node of the driving transistor is initialized to a voltage (for example, a predetermined reference voltage). A test electron beam 525 is injected through the second electron beam injector 520 into the anode of each pixel circuit of the pixel circuit array moved toward the first direction 540.

The second electron beam injector 520 may be coupled to the electron detecting device 530. The electron detecting device 530 detects an output value of secondary electrons 535, that is, the electrons injected through the test electron beam 525 and then emitted again through the anode.

The output value of the secondary electrons is substantially constant for each pixel for which a corresponding driving transistor is operating normally. However, when the driving transistor is operating abnormally, for example, when a leakage current occurs, the output value changes. Accordingly, a failure of the driving transistor cannot be easily and accurately tested with conventional test equipment.

However, according to the exemplary embodiment shown in FIG. 5, operation of the transistor can be accurately tested with high-speed within a short period of time in a large-sized OLED display by controlling the moving speed of the pixel circuit array.

Figure 6:
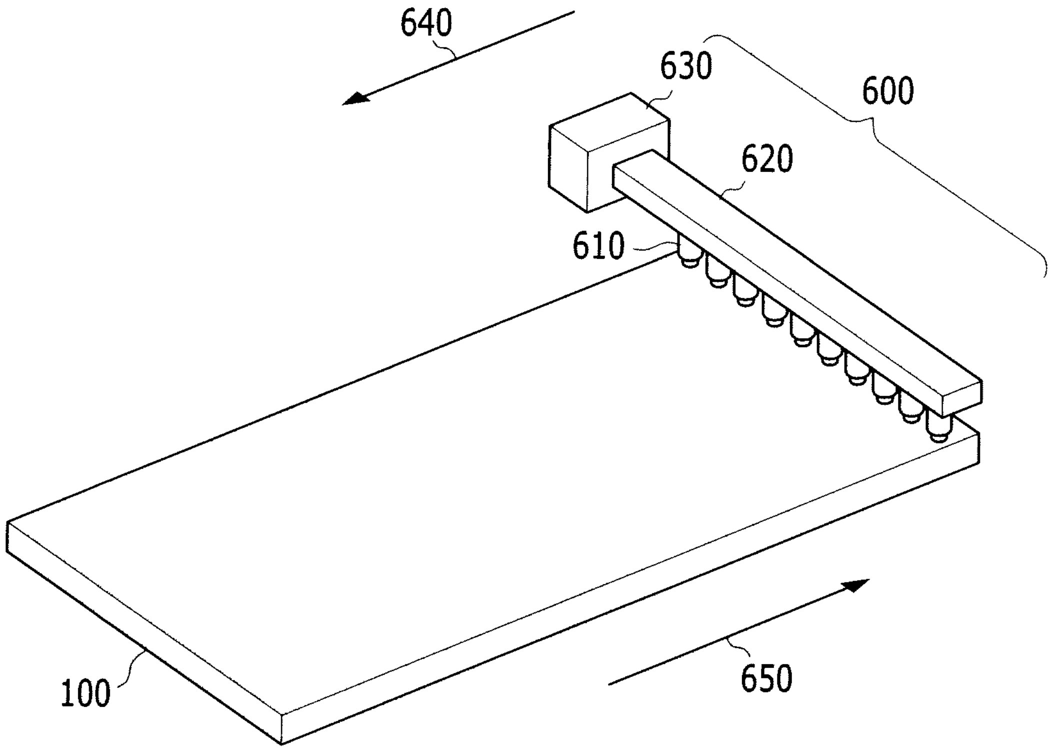
FIG. 6 is a schematic diagram of an array test device according to another exemplary embodiment of the present invention.

FIG. 6 is a schematic diagram of an array test device 600 according to another exemplary embodiment of the present invention. According to the exemplary embodiment shown in FIG. 6, the array test device 600 includes one electron beam injector.

Referring to FIG. 6, an array test device 600 includes a plurality of micro columns 610 respectively including the electron beam injector (for example, the first electron beam injector 510 or the second electron beam injector 520 of FIG. 5) and the electron detecting device (e.g., the electron detector 530 of FIG. 5). The micro columns 610 are arranged in series and then fixed to a fixed axis 620. In addition, each of the plurality of micro columns 610 is coupled to a driver 630 and performs electron beam radiation and secondary electron detection of the pixel circuit array substrate 100. For example, the micro columns 610 may be arranged to test each of the pixel circuits in a same row (pixel line) or column (pixel column) of the pixel circuit array (or a subset of the pixel circuits in the same row or column of the pixel circuit array).

In further detail, the fixed axis 620 moves in the first direction 640 (relative to the pixel circuit array substrate 100) by the driver 630. Thus, each anode of the pixel circuit included in each pixel line or pixel column is irradiated by the electron beam to thereby produce the gate node voltage of the driving transistor of each pixel driving circuit. The pixel circuit array substrate 100 may be attached to a loading unit for use in testing the pixel circuit array substrate 100. The array test device may also be fixed to this loading unit.

Then, the fixed axis 620 moves again with respect to the pixel circuit array substrate 100, this time in a second direction 650. Further, the electron beam is radiated again at the anode of the pixel circuit included in each pixel line or each pixel column, for which the gate node of the corresponding driving transistors are initialized. In this case, the secondary electrons emitted from the anode are detected by the electron detecting device included in the micro column 610. Accordingly, a failure of each of the plurality of pixel circuits can be simultaneously tested.

In further embodiments, more than one fixed axis 620 (where the plurality of micro columns 610 are arranged in a line) may be provided in the same array test device so that the test speed can be further improved. Further, according to an exemplary embodiment, a micro column 610 that can emit an electron beam and detect emitted electrons in a fixed manner (that is, without moving the fixed axis 620 relative to the pixel circuit array substrate 100 separately for initializing as well as for testing) corresponding to the entire pixel circuit lines or pixel circuit columns of the pixel circuit array can also be provided.

The movement of the fixed axis 620 relative to the pixel circuit array substrate 100 can take place at the fixed axis 620, the pixel circuit array substrate 100, or a combination of both. For example, instead of moving the fixed axis 620, the gate electrode of the driving transistor of each pixel may be initialized, and a failure of the transistor may be tested, while moving the pixel circuit array substrate 100—that has been completed with the array process (S1)—in the first direction 640 and the second direction 650.

According to the embodiment of FIG. 6, each of the plurality of micro columns 610 of the array test device 600 of FIG. 6 includes one electron beam injecting device for initialization of the driving transistor and the array test, but the present invention is not limited thereto. That is, the structure of the micro column 610 may be variously modified. In an array test device according to another exemplary embodiment, an electron beam injecting device (for initializing a gate voltage of a driving transistor of a pixel driving circuit) and a plurality of micro columns may be separately formed.

According to the embodiment of FIG. 6, the data node voltages of the driving transistors are concurrently (for example, simultaneously) initialized when an operation failure of each of the driving transistors is tested through the array test prior to the panel (cell) process. Accordingly, the operation failure of the driving transistor can be further accurately determined. When the pixel circuit array is determined to be a bad product, but the pixel circuit array is repairable, the failure is repaired prior to the panel (cell) process so that a manufacturing yield can be improved. On the other hand, a panel (cell) process and a module process are canceled if the pixel circuit array is determined to be an unrepairable bad product so that manufacturing time and cost can be saved or reduced.

While this invention has been described in connection with what is presently considered to be practical exemplary embodiments, it is to be understood that the invention is not limited to the disclosed embodiments. On the contrary, the invention is intended to cover various modifications and equivalent arrangements included within the spirit and scope of the appended claims.

Further, the materials of the components described in the specification may be selectively substituted by various known materials by those skilled in the art. In addition, some of the components described in the specification may be omitted without deterioration of the performance, or added in order to improve the performance by those skilled in the art.

Moreover, the sequence of the steps of the method described in the specification may be changed depending on a process environment or equipment by those skilled in the art. Accordingly, the scope of the present invention should be determined not by the above-mentioned exemplary embodiments but by the appended claims and equivalents thereto.

| Description of selected symbols | |
|---|---|
| 10: pixel | 20: pixel driving circuit |
| 100: pixel circuit array substrate | 111: anode |
| 510, 520: electron beam injector | 530: electron detecting device |
| 515, 525: electron beam | 535: secondary electrons |
| 500, 600: array test device | 610: micro column |
| 620: fixed axis | 630: driver |

What is claimed is:

1. An array test method of an organic light emitting diode (OLED) display substrate comprising a plurality of pixel circuits, each of the pixel circuits comprising an anode of an OLED, a first transistor for transmitting a data signal that controls an amount of light emission of the OLED according to a scan signal, a driving transistor for receiving the data signal, generating a driving current corresponding to the data signal, and transmitting the driving current to the OLED, and a second transistor for diode-connecting a gate electrode and a drain electrode of the driving transistor, the array test method comprising:

injecting electrons or holes that generate an initialization voltage into the anode by turning on the second transistor;

radiating electron beams at the anode; and detecting an amount of secondary electrons emitted from the anode.

2. The array test method of the OLED display substrate of claim 1, wherein, while the second transistor is turned on, the initialization voltage is applied to a gate node of the driving transistor.

3. The array test method of the OLED display substrate of claim 1, wherein the initialization voltage is higher than a threshold voltage of the driving transistor.

4. The array test method of the OLED display substrate of claim 1, wherein the injection of electrons or holes is performed through radiation of electron beams for initialization.

5. The array test method of the OLED display substrate of claim 1, wherein the array test method of the OLED display substrate is performed prior to completion of the OLED by forming an organic light emission layer and a cathode on the anode.

6. The array test method of the OLED display substrate of claim 1, wherein the first transistor comprises a gate electrode coupled to a scan line for transmitting the scan signal, a first electrode coupled to a data line for transmitting the data signal, and a second electrode coupled to the gate electrode of the driving transistor.

7. The array test method of the OLED display substrate of claim 1, wherein the driving transistor comprises the gate electrode coupled to the first transistor for transmitting the data signal, a first electrode coupled to a driving power source for supplying a first power voltage, and a second electrode coupled to the anode.

8. The array test method of the OLED display substrate of claim 1, wherein the second transistor comprises a gate electrode coupled to a gate line for transmitting a gate signal, a first electrode coupled to a node where the driving transistor and the anode are commonly coupled, and a second electrode coupled to the gate electrode of the driving transistor.

9. The array test method of the OLED display substrate of claim 8, wherein the gate signal is a signal that controls switching of the second transistor to compensate a threshold voltage of the driving transistor or to apply an initialization voltage to the gate electrode of the driving transistor.

10. The array test method of the OLED display substrate of claim 1, wherein each of the pixel circuits further comprises:

a first capacitor comprising a first terminal coupled to the first transistor and a second terminal coupled to a driving power source for supplying a first power voltage for transmission of the driving current through the driving transistor to the anode; and a second capacitor comprising a first terminal coupled to the first transistor and a second terminal coupled to the driving transistor.

* * * * *